United States Patent
Jochym et al.

(10) Patent No.: US 6,818,838 B1
(45) Date of Patent: Nov. 16, 2004

(54) PCB COMPONENT PLACEMENT AND TRACE ROUTING THEREBETWEEN

(75) Inventors: Daniel A. Jochym, Downingtown, PA (US); Christian E. Shenberger, Red Lion, PA (US); Joseph N. Closs, Philadelphia, PA (US)

(73) Assignee: Unisys Corporation, Blue Bell, PA (US)

( * ) Notice: Subject to any disclaimer, the term of this patent is extended or adjusted under 35 U.S.C. 154(b) by 29 days.

(21) Appl. No.: 10/390,869

(22) Filed: Mar. 17, 2003

(51) Int. Cl.[7] .................. H05K 12/04; H01R 1/11
(52) U.S. Cl. .............. 174/261; 174/255; 174/260; 174/262; 361/760; 361/767; 361/777
(58) Field of Search .................. 174/250, 255, 174/262, 260, 264, 266, 261; 361/760, 764, 767, 768, 773, 774, 777, 783, 791, 792, 795, 808; 257/778, 737, 738, E25.511

(56) References Cited

U.S. PATENT DOCUMENTS

| | | | | |
|---|---|---|---|---|
| 5,036,431 A | * | 7/1991 | Adachi et al. | 361/803 |
| 5,537,295 A | * | 7/1996 | Van Den Bout et al. | 361/767 |
| 5,630,270 A | * | 5/1997 | O'Malley | 29/832 |
| 6,177,722 B1 | * | 1/2001 | Kovats et al. | 257/690 |
| 6,537,831 B1 | * | 3/2003 | Kline | 438/14 |
| 6,677,668 B1 | * | 1/2004 | Lin | 257/685 |

* cited by examiner

Primary Examiner—David Zarneke
Assistant Examiner—J B Patel
(74) Attorney, Agent, or Firm—Lise A. Rode; Mark T. Starr; RatnerPrestia

(57) ABSTRACT

An apparatus and method for positioning components on a circuit board and routing traces therebetween is disclosed. The circuit board has two pairs of electrical component-receiving footprint and a plurality of traces interconnecting the footprints. The two pairs of electrical component-receiving footprints are spaced from one another in a first direction, wherein the footprints in each of the pairs are substantially aligned in a second direction substantially perpendicular to the first direction, and wherein at least one of the footprints in one of the pairs is offset from at least one of the footprints in the other of the pairs in both the first and second directions. The plurality of traces interconnect each of the footprints includes at least one trace connecting the offset footprints. The trace has a first portion extending from one of the offset footprints toward the other one of the offset footprints in substantially the first direction, a second portion extending from the other one of the offset footprints toward the one of said offset footprints in substantially the first direction, and a third portion extending between the first portion and the second portion in substantially the second direction.

17 Claims, 3 Drawing Sheets

US 6,818,838 B1

PCB COMPONENT PLACEMENT AND TRACE ROUTING THEREBETWEEN

FIELD OF THE INVENTION

The present invention relates to the field of printed circuit boards and, more particularly, to the placement of electrical components on a circuit board and routing traces therebetween.

BACKGROUND OF THE INVENTION

Printed circuit boards (PCBs) are commonly used in electronic devices for supporting and connecting electronic components such as application specific Integrated circuits (ASICs), processors, discrete components, sockets, connectors, and the like (collectively referred to herein as components). Each PCB includes a to circuit board having designated areas (i.e., footprints) on the surface of the circuit board for receiving the components. Such footprints may include vias or pads or other means for electrical coupling to leads of the components they receive. In addition, each PCB includes connection lines (i.e., traces) for connecting the components to one another.

Often, circuit boards contain multiple layers with traces running on one or more layers. Vias, which are conductive elements that extend through holes in the layers of a multi-layer circuit board, connect the components on the surface of the circuit board to traces running on layers other than the surface layer. In addition, vias connect portions of a trace that are routed on different circuit board layers. For example, assume a trace has two portions that together connect a first component and a second component and that the first portion is on a first Inner layer below the surface layer and the second portion Is on a second inner layer below the first inner layer. In this example, a first via connects the first component on the surface layer to the first portion, a second via connects the first portion to the second portion, and a third via connects the second portion to the second component on the surface layer.

Often it is desirable to Interconnect a group of components on a PCB, e.g., to connect each component within a group to each of the other components within the group. FIG. 4 depicts a circuit board 400, a group of four components 402a–d, and a plurality of traces 404a–f interconnecting each component within the group of four components. Conventionally, to interconnect a group of four components 402a–d, the Individual components are arranged to form a grid such that each component Is aligned with at least one other component in a first direction, e.g., along the X axis (horizontally), and at least one other component in a second direction perpendicular to the first direction, e.g., along the Y axis (along the Y axis). For example, a first component 402a is aligned with a second component 402b along the X axis and aligned with a third component 402c along the Y axis.

The traces 404a–f illustrated in FIG. 4 may be a single trace or may represent a signal buss, which generally contains 16 to 512 or more individual traces. The traces between aligned components (i.e., traces 404a, c, e, and f) may be formed using a circuit board 400 with a conventional number of layers and "standard" vias, which extend through all the layers of the circuit board 400. Standard vias are relatively Inexpensive and easy to produce and, since they extend through the entire circuit board, allow complete testing of the PCB from a surface opposite the surface containing the components.

The traces between the diagonal components in FIG. 4 (i.e., traces 404b and 404d), however, result in a congested region 406 between the group of components 402a–d due to the high number of traces that cross toward the midpoint 408 between the components 402a–d. Routing the traces through this congested region 406 to form the necessary connections between diagonal components necessitates the use of unconventional routing techniques, a prohibitively large number of circuit board layers, "buried vias," and/or "blind" vias. Buried vias and blind vias extend through one or more layers of the circuit board, but not through the entire circuit board. Burled and blind vias are relatively expensive and difficult to produce. In addition, since buried and blind vias do not extend through the entire circuit board, the PCB cannot be tested completely from the surface opposite the surface containing the components.

Accordingly, apparatus and methods are needed for positioning components and routing traces therebetween that reduce congestion and are not subject to the above-described limitations. The present Invention satisfies this need among others.

SUMMARY OF THE INVENTION

The present invention is an apparatus and method for positioning components on a circuit board and routing traces therebetween. The circuit board has two pairs of electrical component-receiving footprint and a plurality of traces interconnecting the footprints. The two pairs of electrical component-receiving footprints are spaced from one another in a first direction, wherein the footprints in each of the pairs are substantially aligned in a second direction substantially perpendicular to the first direction, and wherein at least one of the footprints in one of the pairs is offset from at least one of the footprints in the other of the pairs in both the first and second directions. The plurality of traces interconnect each of the footprints includes at least one trace connecting the offset footprints. The trace has a first portion extending from one of the offset footprints toward the other one of the offset footprints in substantially the first direction, a second portion extending from the other one of the offset footprints toward the one of said offset footprints in substantially the first direction, and a third portion extending between the first portion and the second portion in substantially the second direction.

DETAILED DESCRIPTION OF THE INVENTION

Figure 4:
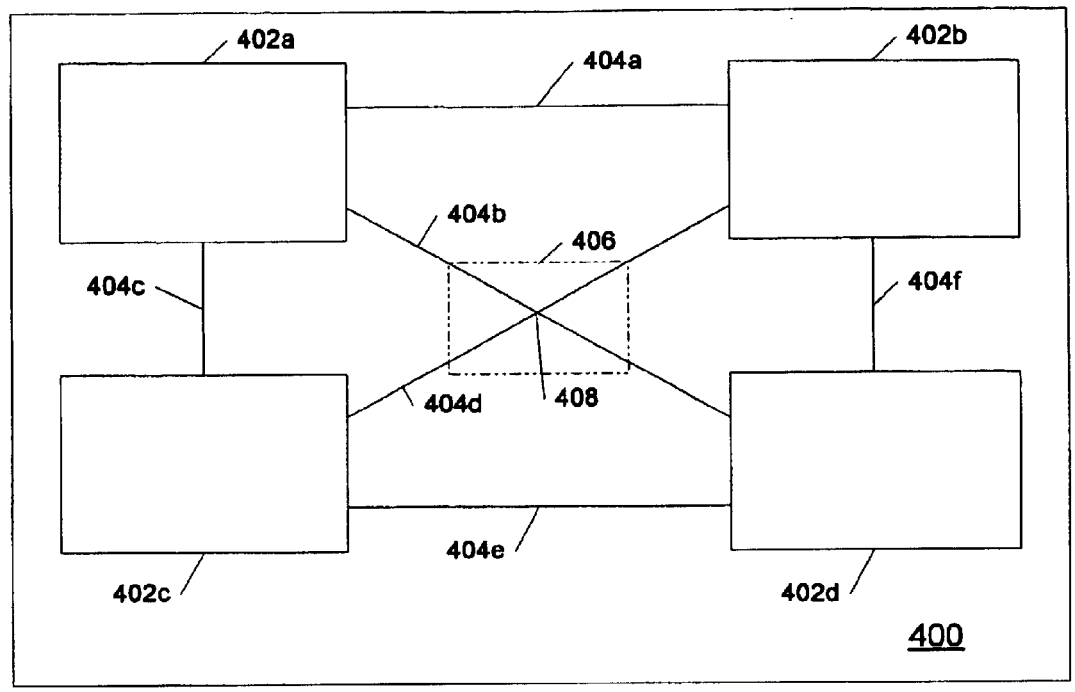
FIG. 4 depicts a block diagram of a circuit board with a prior art component and trace routing topography.

Preferred features of selected embodiments of this invention will now be described with reference to the figures. It will be appreciated that the spirit and scope of the invention is not limited to the embodiments selected for illustration. Also, it should be noted that the drawings are not rendered to any particular scale or proportion. It is contemplated that any of the configurations and materials described hereafter can be modified within the scope of this Invention.

Referring to the figures generally, an exemplary printed circuit board 100 is provided. The printed circuit board 100 includes two pairs of electrical component-receiving footprints 108, 109 spaced from one another in a first direction (e.g., along the X axis) and a plurality of traces 106a–f interconnecting each of the footprints 104a–d. The footprints 104a–d in each of the pairs 108, 109 are substantially aligned in a second direction (e.g., vertically) substantially perpendicular to the first direction and at least one of the footprints (e.g., footprint 104a) in one of the pairs (e.g., pair 108) is offset from at least one of the footprints (e.g., footprint 104c) in the other of the pairs (e.g., pair 109) in both the first and second directions. At least one of the traces (e.g., trace 106b) connects the offset footprints. An exemplary trace 106b has a first portion 134 extending from one of the offset footprints 104a toward the other one of the offset footprints 104c in substantially the first direction, a second portion 136 extending from the other one of the offset footprints 104c toward the one of the offset footprints 104a in substantially the first direction, and a third portion 138 extending between the first portion 134 and the second portion 136 in substantially the second direction.

An exemplary method for configuring traces of a printed circuit board 100 is also provided. The method includes positioning two pairs of component-receiving footprints 108, 109 on a circuit board 100 spaced from one another in a first direction and aligning the footprints 104a–d in each of the pairs 108, 109 in a second direction substantially perpendicular to the first direction. The method also includes offsetting at least one of the footprints (e.g., footprint 104a) in one of the pairs (e.g., pair 108) from at least one of the footprints (e.g., footprint 104c) In the other of the pairs (e.g., pair 109). Further, the method includes orienting a trace (e.g., trace 106b). The exemplary trace 106b is oriented between the offset footprints 104a, 104c such that a first portion 134 extends from one of the offset footprints 104a toward the other one of the offset footprints 104c in substantially the first direction, a second portion 136 extends from the other one of the offset footprints 104c toward the one of the offset footprints 104a in substantially the first direction, and a third portion 138 extends between the first portion 134 and the second portion 136 in substantially the second direction.

Figure 1:
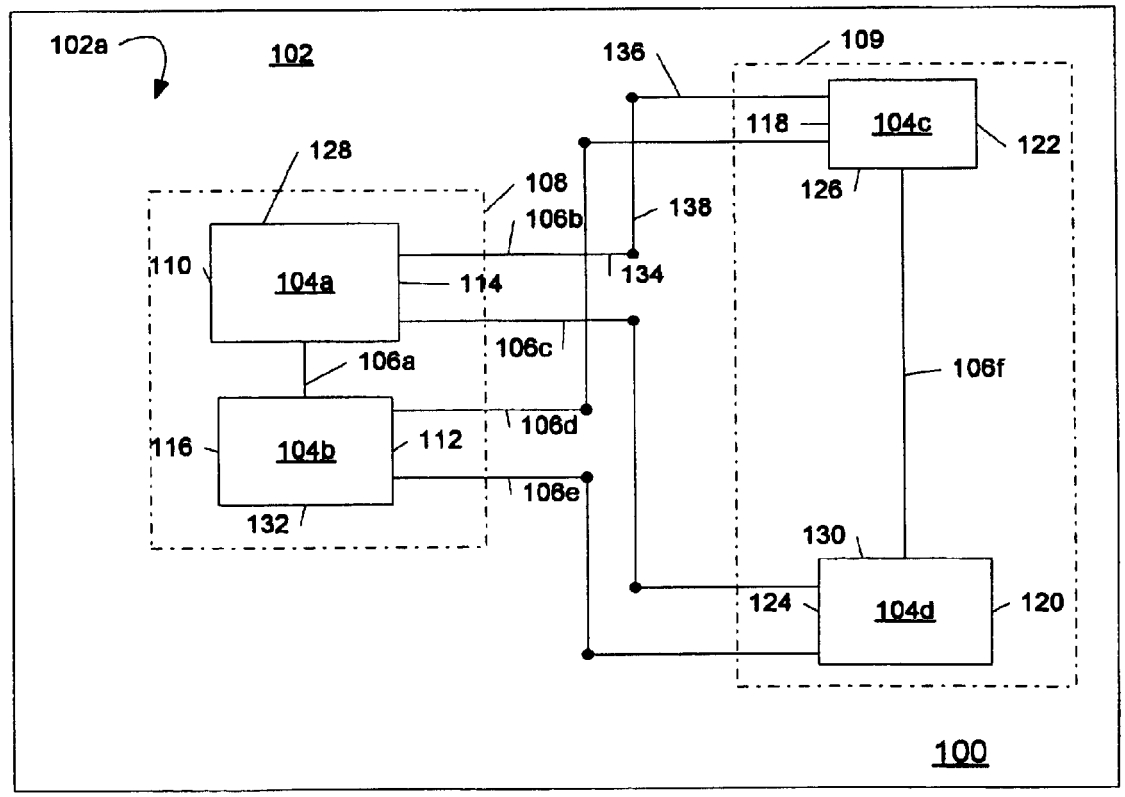
FIG. 1 depicts a block diagram of an exemplary embodiment of a circuit board with a component and trace routing topography in accordance with aspects of the present invention.

The figures are now described in detail. With referenced to FIG. 1, an exemplary embodiment of a printed circuit board (PCB) assembly 100 in accordance with aspects of the present Invention is illustrated. In a general overview, the illustrated PCB assembly 100 includes a circuit board 102, a group of four footprints 104a–d, and a plurality of conductive traces 106a–f interconnecting the four footprints 104a–d. The individual footprints each represent an area on the circuit board 102 for receiving a corresponding component, e.g., ASICs, processors, connectors, discrete components, sockets, etc. In an exemplary embodiment, the components received by each of the four footprints 104a–d are substantially identical. It will be readily apparent to those of skill in the art that the term printed circuit board (PCB) is synonymous with the term printed wiring board (PWB).

The circuit board 102 provides structure for the footprints 104a–d and the conductive traces 106a–f. In an exemplary embodiment, the circuit board 102 is a multi-layer circuit board. The footprints 104a–d are positioned on a surface layer 102a of the circuit board 102. For descriptive purposes, the conductive traces 106a–f interconnecting the individual footprints 104a–d are also shown on the surface layer 102a of the circuit board 102. In the exemplary embodiment, for a multi-layer circuit board, the conductive traces 106a–f are routed on one or more layers of the multi-layer circuit board, which is described In detail below with reference to FIGS. 3A–3C. The conductive traces 106a–f are formed from a conductive material, e.g., copper or aluminum. In an exemplary embodiment, the circuit board 102, footprints 104a–d, and traces 106a–f are formed using conventional techniques that are well known to those of skill in the art of PCB manufacturing.

The positioning of the footprints (and, equivalently, the corresponding components when received) and the routing of traces therebetween is now described in detail. The group of four footprints 104a–d includes a first footprint 104a, a second footprint 104b, a third footprint 104c, and a fourth footprint 104d. Together, the first and second footprints 104a, b form a first footprint pair 108 and the third and fourth footprints 104c, d form a second footprint pair 109 spaced from the first footprint pair 108 in a first direction, e.g., along the X axis. In the illustrated embodiment, each footprint of each footprint pair is aligned with and spaced from the other footprint of the footprint pair in a second direction, e.g., along the Y axis. In an exemplary embodiment, two footprints are aligned if any portion of both footprints lies on an axis and are offset if a common axis does not pass through both footprints.

In certain exemplary embodiments, the first and second footprints 104a, b are aligned along the Y axis if the left hand edge 110 of the first footprint 104a is to the left of the right hand edge 112 of the second footprint 104b and the right hand edge 114 of the first footprint 104a is to the right of the left hand edge 116 of the second footprint 104b. In this embodiment, the third and fourth footprints 104c, d are aligned if the left hand edge 118 of the third footprint 104c is to the left of the right hand edge 120 of the fourth footprint 104d and the right hand edge 122 of the third footprint 104c Is to the right of the left hand edge 124 of the fourth footprint 104d. Likewise, two footprints are aligned along the X axis if the top edge of a first footprint is above the bottom edge of a second footprint and the bottom edge of the first footprint is below the top edge of the second footprint.

The spacing in the second direction between the footprints 104a, b of the first footprint pair 108 and the footprints 104c, d of the second footprint pair 109 is different. In the illustrated embodiment, the spacing between the footprints 104a, b of the first footprint pair 108 is less than the spacing between the footprints 104c, d of the second footprint pair 109. Further, in the illustrated embodiment, the footprints 104a–d are spaced in the second directions such that the bottom edge 126 of the third footprint 104c is above the top edge 128 of the first footprint 104a and the top edge 130 of the fourth footprint 104d is below the bottom edge 132 of the second footprint 104b.

In the illustrated embodiment, a first trace 106a extends from the first footprint 104a to the second footprint 104b, a second trace 106b extends from the first footprint 104a to the third footprint 104c, a third trace 106c extends from the first footprint 104a to the fourth footprint 104d, a fourth trace 106d extends from the second footprint 104b to the third footprint 104c, a fifth trace 106e extends from the second footprint 104b to the fourth footprint 104d, and a sixth trace 104f extends from the third footprint 104c to the fourth footprint 104d. Each of the traces that interconnect the individual footprints represents one of many similar traces, e.g., one of 16 to 512 or more individual traces.

The first and sixth traces 106*a, f* extend substantially in the second direction, e.g., vertical, between the first and second footprints 104*a, b* of the first footprint pair 108 and the third and fourth footprints 104*c, d* of the second footprint pair 109, respectively. In certain exemplary embodiments, the first and sixth traces 106*a, f* may have portions that depart insubstantially from the second direction (e.g., less than 10% of the traces total length), however, as a whole, the portions that make up these traces are substantially In the second direction.

The second, third, fourth, and fifth traces 106*b–e* extend between the first and second footprint pairs 108, 109. In the Illustrated embodiment, generally, the second trace 106*b* includes a first portion 134 extending from the first footprint 104*a* toward the third footprint 104*c* in substantially the first direction (e.g., along the X axis to the right), a second portion 136 extending from the third footprint 104*c* toward the first footprint 104*a* in substantially the first direction (e.g., along the X axis to the left), and a third portion 138 extending in substantially the second to direction (e.g., along the Y axis) between the first and second portions 134, 136. In certain exemplary embodiments, the second trace 106*b* includes additional portions (not illustrated) connecting the portions or within the portions that depart insubstantially from that portion (e.g., less than 10% of the total length). In an exemplary embodiment, for a multi-layer circuit board, portions of the second trace 106*b* are formed on one or more layers of the circuit board with vias forming the connections between layers, which is described In detail below with reference to FIGS. 3A–C. The third, fourth, and fifth traces 106*c–e* have a similar topography to the second trace 106*b* and, therefore, are not described In further detail.

Figure 2:
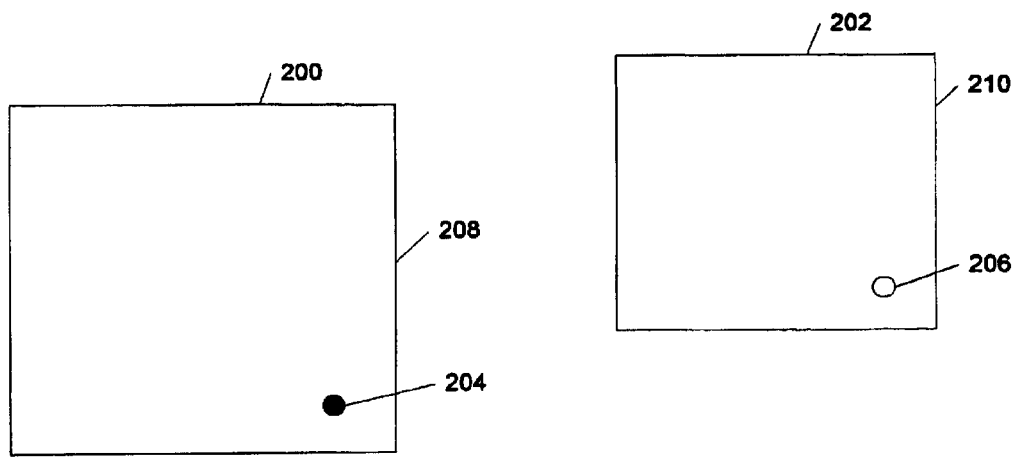
FIG. 2 depicts illustrative bottom views of exemplary embodiments of two electrical components to be connected using the component and trace routing topography of FIG. 1.

An exemplary embodiment of a multi-layer circuit board in accordance with aspects of the present invention is now described in detail with reference to FIGS. 2 and 3A–C. FIG. 2 depicts bottom views of a first component 200 and a second component 202. In an exemplary embodiment, the first component 200 has a plurality of pins (represented by pin 204) and the second component 202 has a plurality of pins (represented by pin 206). The first component 200 has a perimeter 208 that encompasses the pins of the first component 200 and the second component 202 has a perimeter 210 that encompasses the pins of the second component 202. In an exemplary embodiment each of the pins are small balls of a conventional solder material that together form a ball grid array (BGA) on the bottoms of their respective components.

Figure 3A:
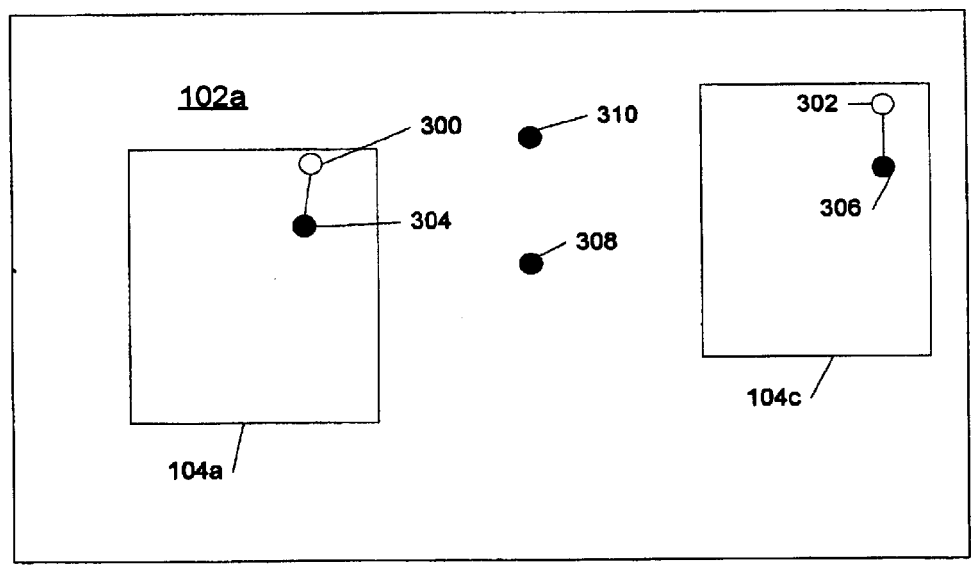
FIG. 3A depicts an illustrative top view of an exemplary embodiment of a surface layer of a multi-layer circuit board in accordance with aspects of the present invention.

FIG. 3A depicts a surface layer 102*a* of a multi-layer circuit board for receiving the components 200, 202 (FIG. 2). The surface layer 102*a* includes the first footprint 104*a* and the third footprint 104*c*. The first footprint 104*a* corresponds to the perimeter 208 of the first component 200 and the third footprint 104*c* corresponds to the perimeter 210 of the second component 202. The first footprint 104*a* includes a plurality of bonding pads (represented by bonding pad 300) corresponding to the pins of the first component 200 and the third footprint 104*c* includes a plurality of bonding pads (represented by bonding pad 302) corresponding to the pins of the second component 202. In an exemplary embodiment, the pins of the first and second components 200, 202 are bonded to the pads of the first and third footprints 104*a, c*, respectively, on the surface layer 102*a* of the multi-layer circuit board in a well known manner, thereby securing the first and second components 200, 202 to the multi-layer circuit board.

The surface layer 102*a* further includes conductive vias. A first conductive via 304 is coupled to the bonding pad 300 of the first footprint 104*a* and a second conductive via 306 is coupled to the bonding pad 302 of the third footprint 104*c*. A third conductive via 308 and a fourth conductive via 310, which are described in further detail below, are positioned between the first footprint 104*a* and the third footprint 104*c*. In an exemplary embodiment, each of the vlas 304, 306, 1*a* 308, and 310 extends through every layer of the multi-layer circuit board, thereby allowing the components and traces on the circuit board to be tested from a surface of the multi-layer circuit board opposite the illustrated surface layer 102*a*. In certain exemplary embodiments, one or more of the vias are buried and/or blind vias.

Figure 3B:
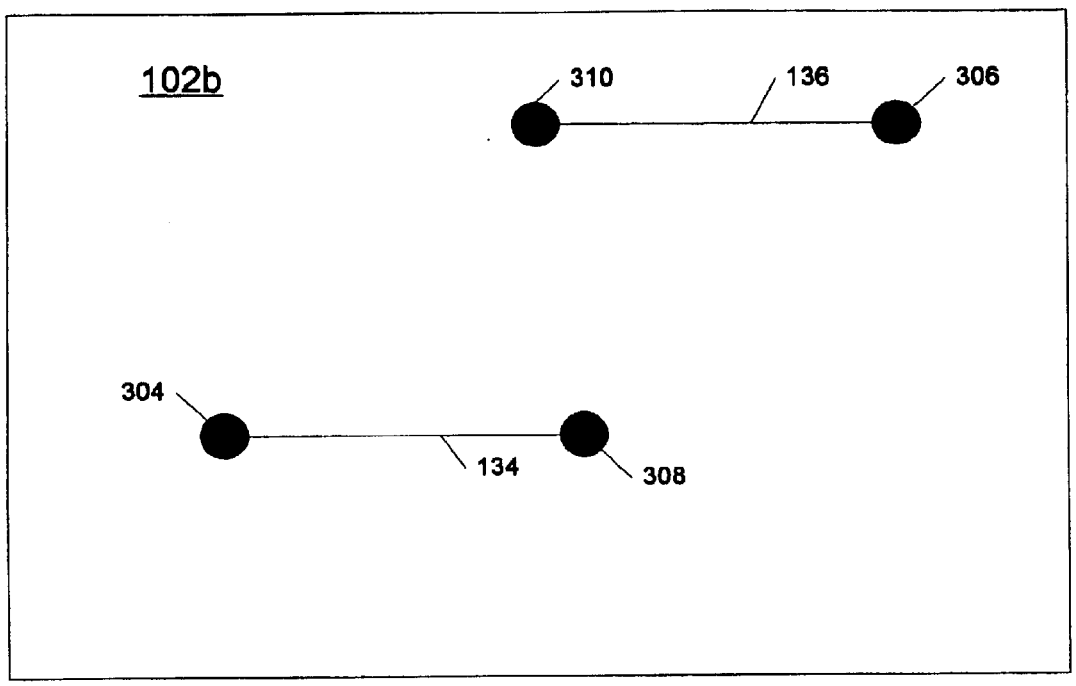
FIG. 3B depicts an illustrative top view of a first inner layer of the multi-layer circuit board of FIG. 3A.

FIG. 3B illustrates a first inner layer 102*b*. The first inner layer 102*b* is a layer of the multi-layer circuit board under the surface layer 102*a*. The illustrated first inner layer 102*b* includes the first, second, third, and fourth vias 304, 306, 308, and 310. The illustrated first inner layer 102*b* includes the first and second portions 134, 136 of the second trace 106*b*. The first inner layer 102*b* may be any of the layers of the multi-layer circuit board.

Figure 3C:
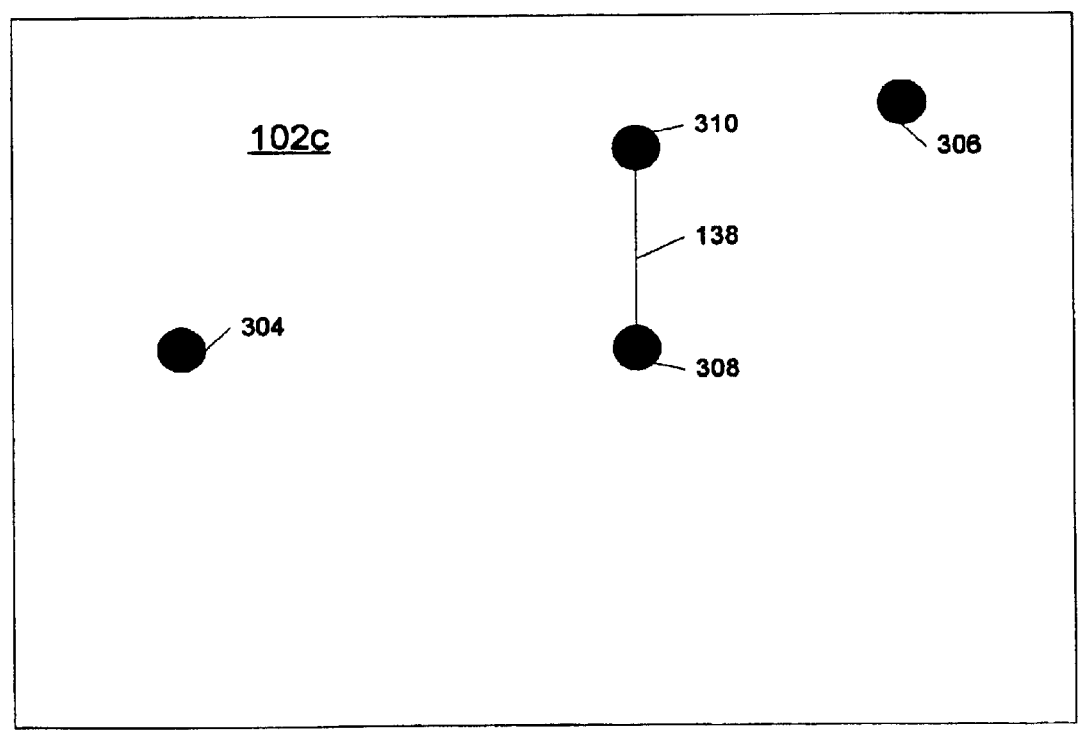
FIG. 3C depicts an illustrative top view of a second inner layer of the multi-layer circuit board of FIG. 3A.

FIG. 3C illustrates a second inner layer 102*c*. The second inner layer 102*c* is a layer of the multi-layer circuit board under the surface layer 102*a*. The illustrated second inner layer 102*c* includes the first, second, third, and fourth vias 304, 306, 308, and 310. The illustrated second inner layer 102*c* includes the third portion 138 of the second trace 106*b*. The second inner layer 102*c* may be any of the layers of the multi-layer circuit board. In an exemplary embodiment, the third portion 138 is between the first and second portions 134, 136 at essentially any point between the first via 304 and the second via 306, including under either footprint 104*a, b*.

An exemplary use of the multi-layer circuit illustrated in FIGS. 3A–C is now described with reference to FIGS. 2 and 3A–C. An electrical signal generated by the first component 200 (FIG. 2) at the first pin 204 passes through the pad 300 (FIG. 3A) and the first via 304 to the first portion 134 of a trace on the first inner layer 102*b*. The signal then passes through the first portion 134 and the third via 308 to the third portion 138 of the trace on the second inner layer 102*c*. The signal then passes through the third portion 138 and the fourth via 310 to the second portion 136 of the trace on the first inner layer 102*b*. Finally, the signal passes through the second portion 136, the second via 306, and the second pad 302 to the second pin 206 (FIG. 2) of the second component 202. Since the third portion 138 is orthogonal to the first and second portions 134, 136, and is routed on different layers, coupling between traces is reduced when multiple traces are passing signals with the first and second portions of some traces overlapping the third portion of other traces. An electrical signal generated by the second component 202 passes to the first component 200 in a similar manner and, thus, is not described in further detail.

Although the second trace 106*b* Is illustrated as having three portions 134, 136, and 138 with two of the portions 134, 136 on a first inner layer 102*b* and one of the portions 138 on a second inner layer 102*c*, any portion may be on any layer of the multi-layer circuit board, including the surface layer 102*a*. For example, in one embodiment, the first and second portions 134, 136 may be on the first inner layer 102*b* as illustrated and the third portion 138 may be on the surface layer 102*a*. In an alternative embodiment, all of the portions are on the same layer. In another alternative embodiment each of the portions are on different layers. In another alternative embodiment, the first and third portions are on the first inner layer and the second portion is on the second layer. Various alternative embodiments will be readily apparent to those of skill in the art and are considered within the scope of the present invention.

Although the invention is illustrated and described herein with reference to specific embodiments, the invention is not intended to be limited to the details shown. Rather, various modifications may be made in the details within the scope and range of equivalents of the claims and without departing from the invention.

What is claimed:

1. A printed circuit board comprising:

two pairs of electrical component-receiving footprints spaced from one another in a first direction, wherein said footprints in each of said pairs are substantially aligned in a second direction substantially perpendicular to said first direction, and wherein at least one of said footprints in one of said pairs is offset from at least one of said footprints in the other of said pairs in both said first and second directions; and a plurality of traces interconnecting each of said footprints, at least one of said traces connecting said offset footprints, said trace having a first portion extending from one of said offset footprints toward the other one of said offset footprints in substantially the first direction, a second portion extending from the other one of said offset footprints toward said one of said offset footprints in substantially the first direction, and a third portion extending between said first portion and said second portion in substantially the second direction.

2. The printed circuit board of claim 1, wherein each of said footprint pairs includes a first footprint and a second footprint aligned along an axis;

wherein said first and second footprints are aligned if at least a portion of each of said first and second footprints is on said axis.

3. The printed circuit board of claim 1, wherein each of said footprint pairs includes a first footprint and a second footprint aligned along a Y axis; and wherein said first and second footprints of each of said footprint pairs are substantially aligned if a left hand edge of said first footprint is to the left of a right hand edge of said second footprint and a right hand edge of said first footprint is to the right of the left hand edge of said second footprint.

4. The printed circuit board of claim 1, wherein each of said footprint pairs includes a first footprint and a second footprint aligned along an X axis; and wherein said first and second footprints of each of said footprint pairs are substantially aligned if a bottom edge of said first footprint is below a top edge of said second footprint and a top edge of said first footprint is above the bottom edge of said second footprint.

5. The printed circuit board of claim 1, wherein a first of said pair of footprints includes a first footprint above and substantially aligned with a second footprint and a second of said pair of footprints includes a third footprint above and substantially aligned with a fourth footprint; and wherein said first footprint is spaced from said second footprint and said third footprint is spaced from said fourth footprint such that a bottom edge of said third footprint is above a top edge of said first footprint and a top edge of said fourth footprint is below a bottom edge of said second footprint.

6. The printed circuit board of claim 5, wherein a first trace of said plurality of traces has a first portion extending from the first footprint toward the third footprint in substantially the first direction, a second portion extending from the third footprint toward the first footprint in substantially the first direction and a third portion extending between the first and second portions in substantially the second direction;

wherein a second trace of said plurality of traces has a first portion extending from the first footprint toward the fourth footprint in substantially the first directions, a second portion extending from the fourth footprint toward the first footprint in substantially the first direction and a third portion extending between the first and second portions in substantially the second direction;

wherein a third trace of said plurality of traces has a first portion extending from the second footprint toward the third footprint in substantially the first directions, a second portion extending from the third footprint toward the second footprint in substantially the first direction and a third portion extending between the first and second portions in substantially the second direction; and wherein a fourth trace of said plurality of traces has a first portion extending from the second footprint toward the fourth footprint in substantially the first directions, a second portion extending from the fourth footprint toward the second footprint in substantially the first direction and a third portion extending between the first and second portions in substantially the second direction.

7. The printed circuit board of claim 1, wherein said circuit board is a multi-layer circuit board having a plurality of conductive vias, each of said plurality of conductive vias extending through each layer of the multi-layer circuit board; and wherein at least one portion of said trace is on a different layer than at least one other portion of said trace, wherein said portions on different layers are electrically coupled through one of said plurality of conductive vias.

8. The printed circuit board of claim 1, wherein each of said footprints is substantially identical.

9. A printed circuit board apparatus comprising:

a plurality of components;

two pairs of electrical component-receiving footprints spaced from one another in a first direction, wherein said footprints in each of said pairs are substantially aligned in a second direction substantially perpendicular to said first direction, and wherein at least one of said footprints in one of said pairs is offset from at least one of said footprints in the other of said pairs in both said first and second directions; and a plurality of traces interconnecting each of said footprints, at least one of said traces connecting said offset footprints, said trace having a first portion extending from one of said offset footprints in substantially the first direction, a second portion extending from the other one of said offset footprints in substantially the first direction, and a third portion extending between said first portion and said second portion in substantially the second direction.

10. The apparatus of claim 9, wherein each of said components received by each of said footprints is substantially identical.

11. The apparatus of claim 9, wherein each of said components received by each of said footprints is a substantially identical application specific integrated circuit (ASIC).

12. The apparatus of claim 9, wherein each of said components received by each of said footprints comprises a plurality of conductive structures and wherein each footprint comprises a plurality of conductive pads corresponding to each of the conductive structures, each of said plurality of conductive structures being bonded to each of said plurality of conductive pads.

13. The apparatus of claim 12, wherein the circuit board has a plurality of layers, the footprints are on a surface layer of the circuit board and at least one of said traces is on a layer of said circuit board other than the surface layer, wherein the apparatus further comprises:

a plurality of vias extending through each layer of the circuit board, at least one of said plurality of vias electrically coupling one of said conductive pads to said at least one trace on the layer of said circuit board other than the surface layer.

14. The apparatus of claim 9, wherein each of said footprint pairs includes a first footprint and a second footprint aligned along an axis;

wherein said first and second footprints are aligned if at least a portion of each of said first and second footprints is on said axis.

15. The apparatus of claim 9, wherein each of said footprint pairs includes a first footprint and a second footprint aligned along a Y axis; and wherein said first and second footprints of each of said footprint pairs are substantially aligned if a left hand edge of said first footprint is to the left of a right hand edge of said second footprint and a right hand edge of said first footprint is to the right of the left hand edge of said second footprint.

16. The apparatus of claim 9, wherein each of said footprint pairs includes a first footprint and a second footprint aligned along an X axis; and wherein said first and second footprints of each of said footprint pairs are substantially aligned if a bottom edge of said first footprint Is below a top edge of said second footprint and a top edge of said first footprint is above the bottom edge of said second footprint.

17. A printed circuit board comprising:

two pairs of electrical component-receiving footprints spaced from one another in a first direction, wherein said footprints in each of said pairs are substantially aligned in a second direction substantially perpendicular to said first direction, and wherein each of said footprints in one of said pairs is offset from each of said footprints in the other of said pairs in both said first and second directions; and a plurality of traces interconnecting each of said footprints, wherein at least one trace between each offset footprint has a first portion extending from one of said offset footprints toward the other one of said offset footprints in substantially the first direction, a second portion extending from the other one of said offset footprints toward said one of said offset footprints in substantially the first direction, and a third portion extending between said first portion and said second portion in substantially the second direction.

* * * * *